(12) United States Patent
Chu et al.

(10) Patent No.: US 7,113,757 B2
(45) Date of Patent: Sep. 26, 2006

(54) METHOD AND ITS APPARATUS FOR INCREASING OUTPUT POWER OF THE CARRIERS OF WIDE-BAND MULTI-CARRIER BASE STATION

(75) Inventors: Qing Chu, Shen Zhen (CN); Yuxin Su, Shen-Zhen (CN); Qingquan Peng, Shen Zhen (CN); Huabing Jiang, Shen Zhen (CN)

(73) Assignee: Huawei Technologies, Co., Ltd., Shen-Zhen (CN)

( * ) Notice: Subject to any disclaimer, the term of this patent is extended or adjusted under 35 U.S.C. 154(b) by 370 days.

(21) Appl. No.: 10/395,519

(22) Filed: Mar. 24, 2003

(65) Prior Publication Data
US 2003/0162514 A1 Aug. 28, 2003

Related U.S. Application Data

(63) Continuation of application No. PCT/CN01/00817, filed on May 21, 2001.

(30) Foreign Application Priority Data
Sep. 26, 2000 (CN) ............................... 00 1 25407

(51) Int. Cl.
*H04B 1/02* (2006.01)
*H04B 1/04* (2006.01)
*H04B 7/00* (2006.01)
*H04K 1/10* (2006.01)

(52) U.S. Cl. .................... 455/127; 455/103; 455/104; 455/127.1; 455/127.2; 455/127.5; 455/522; 375/260; 375/297

(58) Field of Classification Search ................. 455/69, 455/127.1–127.2, 127.5, 522, 103–104; 375/260, 375/297
See application file for complete search history.

(56) References Cited

U.S. PATENT DOCUMENTS

| 5,659,892 A | 8/1997 | Soleimani et al. |
| 6,167,099 A * | 12/2000 | Rader et al. ................. 375/347 |
| 2002/0090915 A1* | 7/2002 | Komara et al. ............... 455/69 |

FOREIGN PATENT DOCUMENTS

EP 0762661 A2 3/1997

* cited by examiner

*Primary Examiner*—Charles Appiah
*Assistant Examiner*—Michael Thier
(74) *Attorney, Agent, or Firm*—Dorsey & Whitney LLP

(57) ABSTRACT

A method and apparatus of increasing output power of a plurality of carriers of a wide-band multi-carrier base station system utilizes gain adjusting coefficients to adjust output amplitude of the carriers to satisfy the requirement of the wide-band base station system for different number of carriers and output power. The output power of each of or a part of the carriers is increased when the number of carriers is reduced. Under the premise of not modifying the hardware and satisfying the requirement of protocol specification, the wide-band base station system supports different number of carriers by setting software so that the output power of the respective carriers and the coverage of the base station can be increased when the carriers do not operate in a full configuration.

8 Claims, 1 Drawing Sheet

METHOD AND ITS APPARATUS FOR INCREASING OUTPUT POWER OF THE CARRIERS OF WIDE-BAND MULTI-CARRIER BASE STATION

CROSS-REFERENCE TO RELATED APPLICATION

This utility patent application is a continuation application of and claims priority of the PCT International Patent Application, serial number PCT/CN01/00817, filed on May 21, 2001, which claims the priority of the Chinese patent application, serial number CN 00125407.3, filed on Sep. 26, 2000, the subject matter of which is incorporated herewith by reference.

FIELD OF THE INVENTION

The present invention relates to a method for increasing output power of carriers of a wide-band multi-carrier base station, which is suitable for using in a wide-band radio system.

BACKGROUND OF THE INVENTION

Following the development of very large-scale digital integrated circuit (VLSI) technology, the radio communication field has experienced two transformations from analog to digital and from stationary to mobile. However, the radio communication field continuously has many problems derived from, for example, the coexistence of a plurality of communication systems, the fierce competition of various standards, and the pressing for frequency resources, etc. To solve these problems, it is much desirable to have the third transformation in the radio communication field from hardware to software and from a narrow-band system to a wide-band system.

An inevitable trend of the development of a base station system is a wide-band base station. The benefit brought by the wide-band base station is that it is easy to produce, with low cost, more functions and better performance. Generally, a radio base station system is capable of operating multiple carriers simultaneously by using wide-band software. It is required that under the premise of not modifying the hardware, the number of multiple carriers (within the capacity range designed) required by the user can be satisfied by setting the software. To accomplish this, the entire base station is designed according to the maximum capacity, and when it is used practically, a proper number of multiple carriers in a digital intermediate frequency band or a base frequency band portion are closed off to satisfy the number of multiple carriers required by the user. However, in a wide-band system, the portions from an intermediate frequency to an antenna feed are common portions. Thus, the above solution would not use these portions efficiently, thereby causing low operation efficiency and high operation cost of a base station.

Generally, to expand the coverage of a base station, it is desired to have transmission power of the respective carriers as high as possible. It is also desired that a wide-band base station has the ability of increasing output power of the respective carriers under a condition that a full configuration of the base station is not used, for example, a number of multiple carriers in a digital intermediate frequency band or a base frequency band portion are closed off to satisfy the number of multiple carriers required by the user.

SUMMARY OF THE INVENTION

The present invention overcomes the above and other disadvantages by providing a method and apparatus for increasing the output power of carriers of a wide-band multi-carrier base station under the premise of not modifying hardware and satisfying the requirement of protocol specification. The present invention is capable of utilizing sufficiently the potentiality of the output power of a power amplifier to increase the output power of the respective carriers.

The method for increasing the output power of carriers of a wide-band multi-carrier base station comprises the steps of:

(1) providing a wide-band base station according to maximum capacity of a wide-band base station system design and assigned specifications, which satisfies system performance specification under a full configuration;

(2) closing off a corresponding number of carrier channels by using software when the number of carriers is required to be reduced for outputting;

(3) setting gain adjusting coefficients of respective carriers, which cause output power of each of the respective carriers to be increased, the setting of the gain adjusting coefficients being based on the number of carriers supported by the wide-band base station and practical requirement of a user and according to a certain calculation method; and (4) storing the gain adjusting coefficients for the respective carriers in corresponding registers, the gain adjusting coefficients being retrieved based on a configuration condition to control a gain of the respective carriers to reach maximum output power.

In a method for increasing the output power of the carriers of the wide-band multi-carrier base station as mentioned above, once the gain adjusting coefficients of the respective carriers obtained in step (3) are set, they do not change. When the number of carriers or some particular requirements required by a user are changed, the gain adjusting coefficients will be obtained again according to the steps (1), (2), and (3).

In a method for increasing the output power of the carriers of the wide-band multi-carrier base station as mentioned above, the principles for setting the gain adjusting coefficients of each of the respective carriers are:

a) the satisfaction of the system specification is a condition;

b) when the number of carriers is reduced, peak power of combined carrier signals may be smaller than that of the full configuration (i.e. all carriers are used). However, the total average power outputted by a power amplifier may be equal to or slightly larger than a total average output power of the full configuration;

c) the configurations with different number of carriers correspond to the different gain adjusting coefficients; and when the configurations have the same number of carriers, the coefficients of the number of the respective carriers can be different, however, the condition of step b) is satisfied;

d) the less the number of carriers, the more total average power outputted from a power amplifier will be, however, the lower the peak power will be, and vise versa.

e) the calculation method for all of the gain adjusting coefficients are under the premise of not modifying the hardware and satisfying the specification requirement.

In the method for increasing the output power of the carriers of the wide-band multi-carrier base station as mentioned above, the gain adjusting coefficients are used by the method to adjust output amplitudes of the carriers to satisfy the requirement for different number of carriers and different output power of the wide-band base station system. The output power of each carrier or a part of carriers is increased when the number of carriers is reduced.

In the method for increasing the output power of the carriers of the wide-band multi-carrier base station as mentioned above, the calculation method for the gain adjusting coefficients of increasing the output power of the carriers provides that when the number of carriers is reduced, the summation of the average output power of the respective carriers can be equal to or slightly larger than the average output power of the power amplifier of the full configuration, and at the same time, the peak power is less than the peak power of the full configuration.

In the method for increasing the output power of the carriers of the wide-band multi-carrier base station as mentioned above, the setting of the gain adjusting coefficients is based on: the different number of carriers corresponds to the different gain adjusting coefficients, and when the configuration of the number of carriers is the same, the gain adjusting coefficient of the respective carriers may be different.

The apparatus for increasing the output power of the carriers of the wide-band multi-carrier base station as mentioned above comprises a wide-band base station which is capable of increasing the output power of the carriers. The base station comprises: a plurality of baseband processing units, a plurality of corresponding digital up-converters which involve the gain adjusting function, a multiplexing and combining adder, a high performance wide-band digital to analog converter DAC, a wide-band transmitter, and a wide-band power amplifier. The outputs of the plurality of baseband processing units are connected to the input terminals of a plurality of digital up-converters, respectively. The outputs of the respective digital up-converters are outputted to the high performance wide-band digital to analog converters DACs via a multiplexing and combining adder, then from the high performance wide-band digital to analog converters DACs, via the wide-band transmitter, and from the wide-band power amplifier, outputted to an antenna to be transmitted by the antenna.

In the apparatus for increasing the output power of the carriers of the wide-band multi-carrier base station as mentioned above, each of the digital up-converters comprises a modulator, a first multiplier, an interpolator and filter, a second multiplier, and a digital controlled oscillator. The signals from one of the baseband processors are modulated and then outputted to the first multiplier, and at the same time, the calculated gain adjusting coefficients are also inputted to the first multiplier. The outputs of the first multiplier are sent to the second multiplier after interpolating and filtering. An oscillating signal is also outputted by the digital controlled oscillator to the second multiplier at the same time. The signals are then outputted from the second multiplier to the adder.

In the apparatus for increasing the output power of the carriers of the wide-band multi-carrier base station as mentioned above, the first and second multipliers are low rate digital multipliers.

Because the above technical scheme is employed in the invention to multiply each of the respective carriers in the digital up-converters by a ratio coefficient relative to the number of carriers, the output power of each carrier or a certain carrier can be increased under the premise of satisfying the specification and not modifying the hardware. The method allows the base station to be able to support for outputting different number of carriers under the premise of satisfying the specification and not modifying the hardware by only setting the software. The output capability of the wide-band base station is utilized sufficiently such that the output power of each carrier is increased when the carriers do not operate in the full configuration, and the coverage of the base station is increased.

DETAILED DESCRIPTION OF THE PREFERRED EMBODIMENTS

One of the main features of a wide-band base station system is that the portions from a digital combination to an antenna are used commonly by the respective carriers, and it is expected that they are wide-band and super-linear. The other multi-carrier combination signals are non-constant envelope signals, useful information of the respective carriers is carried by their envelopes. Therefore, it is desired that the envelopes of the combination signals of the portions from the digital combination to the antenna is as less distortion as possible. The average power of N equal amplitude carrier combination signals is N times that of a single carrier, and the peak power is $N^2$ times that of a single carrier. Thus, the more the number of carriers, the higher the requirement of the system linearity and dynamic range is. Generally, increasing the linearity of a wide-band base station system is at the cost of sacrificing the efficiency. Therefore, the operation efficiency of the wide-band base station system is normally not high, such that the output power of the respective carriers being increased as high as possible under the premise of satisfying the specification will be of great importance to the increase of the system operation efficiency and the increase of the coverage.

The theme of the present invention is to design the whole wide-band base station system firstly according to the maximum capacity to allow the system to satisfy the specification requirement in a full configuration; when the number of carriers is reduced, the corresponding carrier transmission power can be increased by varying properly the ratio coefficients in each of or some of the digital up-converters. When the number of carriers is reduced, the total dynamic range of a DAC is subjected to a certain loss in an implementation method. However, the dynamic range of a single carrier will be increased following the decrease of the number of carriers, that is, the dynamic range of the signals does not have any loss. As long as under a situation that DAC is not saturated, the linearity of the other wide-band base station system is normally unchanged when operating, the total average power of the multi-carrier combination signals is approximate, and the specification of linearity of the multi-carrier signals outputted by the power amplifier can be ensured. When the number of carriers is reduced, the peak power of the multi-carrier combination signals follows to be reduced. The output power of each of or some of the carriers can be increased properly. Thus, increasing the output power of the carriers can be implemented under the condition of not modifying the hardware and not affecting the output specification.

Figure 1:
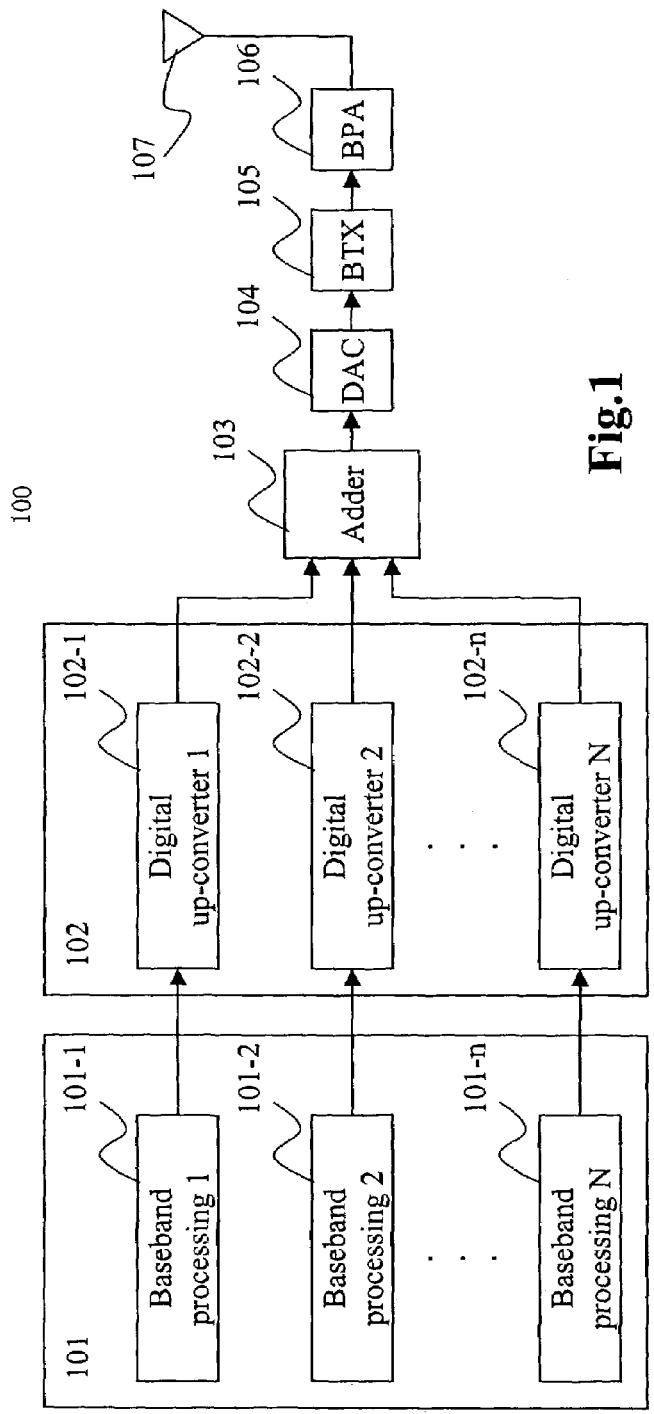
FIG. 1 is a block diagram of one embodiment of a wide-band transmitter that supports different number of carriers outputting in a wide-band base station system in accordance with the principles of the present invention.

FIG. 1 illustrates one embodiment of a wide-band transmitter which supports N carriers for increasing the output power of the carriers of a wide-band multi-carrier base station system 100. The base station system 100 includes a plurality of baseband processors 101-1 ... 101-n, a plurality of corresponding digital up-converters 102-1 ... 102-n which provide a gain adjusting function, a multiplexing and combining adder 103, a high performance wide-band DAC 104, a wide-band transmitter 105, and a wide-band power amplifier 106. The outputs of the plurality of baseband processing units 101-1 ... 101-n are connected one by one to the input of the plurality of digital up-converters 102-1 ... 102-n, respectively.

Functions, such as a channel encoding and interleaving, are implemented by the baseband processor section 101, wherein the baseband processors 101-1 ... 1-n represent respectively the baseband processors of n carrier frequencies having the same structure, and the signals are transmitted from the baseband processor 101 to the digital up-converter 102. The modulation, interpolation, filtering, digital up-conversion of the signals, and the other functions, such as power control and gain adjustment, are implemented mainly by the digital up-converter 102, wherein the digital up-converters 102-1 ... 102-n represent respectively N digital up-converters having the same structure. N carrier frequencies, which are independent from each other, are formed by the N digital up-converters 102-1 ... 102-n together with the baseband processors 101-1 ... 101-n. Adding the outputs of N digital up-converters 102-1 ... 102-n is implemented in the digital multiplexing and combining adder 103, wherein the signals of the multiple carriers in a digital domain are combined. The combined signals are non-constant envelope signals, and the transition from a narrow-band to a wide-band is implemented in the adder 103.

The conversion from digital to analog is implemented by the digital to analog converter DAC 104. The converter DAC 104 is a bridge between the digital circuit and the analog circuit, starting from 102. The base-band system support the wide-band multi-carrier operation. The operation, such as filtering, frequency shifting, and amplifying the respective carriers to the expected level, and the like, are implemented by the wide-band transmitter BTX 105, and the power amplification of the multi-carrier signals is implemented by the wide-band power amplifier BPA 106. The amplified signals are outputted to the antenna 107 for transmitting. The wide-band multi-carrier signals are supported to operate simultaneously from the digital adder 103 to the antenna 107 to reduce the effects among the respective carriers. The operation from the digital adder 103 and the antenna 107 has very high linearity and stability, and the linearity of the wide-band base station system is reflected mainly by the digital to analog converter DAC 104, the wide-band transmitter BTX 105, and the wide-band power amplifier BPA 106.

The outputs of the respective digital up-converters 102-1 ... 102-n are outputted to the high performance wide-band DAC 104 via the multiplexing combination adder 103, after being outputted from the high performance wide-band converter DAC 104 to the wide-band power amplifier 106 via the wide-band transmitter 105, and the signals are then outputted to the antenna 107 for transmitting.

Figure 2:
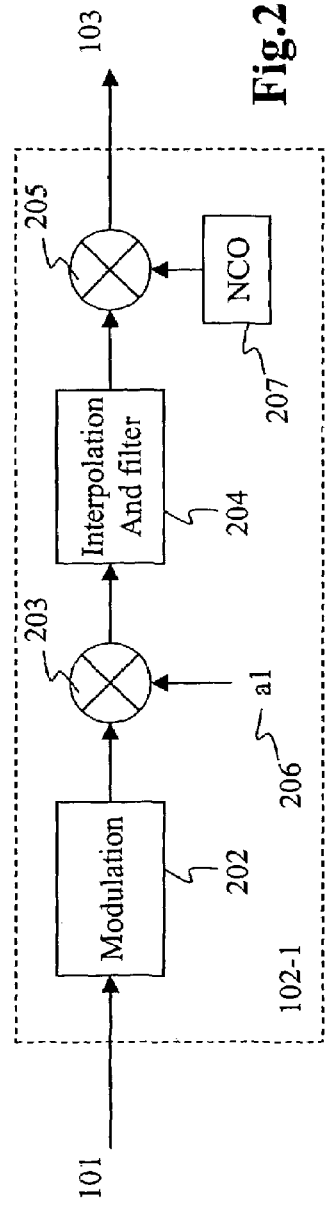
FIG. 2 is an internal structure block diagram of one embodiment of a digital upconverter in the wide-band transmitter in accordance with the principles of the present invention.

The internal structure block diagram of each digital up-converter 102 is shown in FIG. 2. Each digital up-converter 102 described in an apparatus for increasing the output power of the carriers of the wide-band multi-carrier base station system 100 of the present invention comprises a modulator 202, a first multiplier 203, an interpolation and filter 204, a second multiplier 205, and a digital controlled oscillator 207. The signals from one of the baseband processors 101 are outputted to the modulator 202 and then to the first multiplier 203. At the same time, the calculated gain adjusting coefficients 206 are also inputted to the first multiplier 203. The outputs of the first multiplier 203 are sent to the second multiplier 205 via the interpolation and filter 204. An oscillating signal is sent from the digital controlled oscillator 207 to the second multiplier 205. The signals from the second multiplier 205 are sent to the adder 103.

The modulator 202 is used to provide a plurality of modulation modes based on the requirement of the users. The interpolation and filter 204 is used to increase the signal or data rate and filter frequency components introduced by the interpolation. The second multiplier 205 and the digital controlled oscillator 207 are used to implement frequency shift by using a digital mixing method such that the baseband signals are shifted to an intermediate frequency band. The oscillating signal used by the digital mixing method is provided by the digital controlled oscillator NCO 207. The gain adjusting multiplier, i.e. the first multiplier 203, is used to adjust the signal amplitude of a carrier output so as to reduce system resources. The gain adjusting multiplier 203 is disposed preceding to the interpolation such that the multiplier 203 uses the coefficients 206 to allow the wide-band base station system 100 to increase the output power of each carrier when the number of carriers is reduced.

The first multiplier 203 and the second multiplier 205 are low rate digital multipliers. One of the functions of the multipliers 203, 205 is to reduce the consumption of the system resources.

Accordingly, the operation steps of the present invention are as follows:

1. A wide-band base station system is designed according to the maximum capacity of the system design and the specification assigned, thereby causing the high performance wide-band DAC 104, the wide-band transmitter 105, and the wide-band power amplifier 106 to satisfy the system performance specification under a full configuration, under the premise that the system satisfies the specification, and the power output capability of the wide-band power amplifier is used as much as possible.

2. When the number of carriers for outputting is required to be reduced, the corresponding number of carrier channels is closed off by using directly the software. For example, the power supply is stopped to supply to the baseband processor section 101-i and the digital up-converter 102-i (i is a carrier channel which is required to be closed off).

3. The gain adjusting coefficients 206 of the respective carriers are set based on the number of carriers supported by the wide-band base station system and the requirement of the users and according to a certain calculation method, thereby increasing the output power of a part of or each of the carriers. The following principles are followed when the gain adjusting coefficients 206 of the respective carriers are set:

a. the increasing of the output power of each carrier by setting the coefficient 206, is limited by the condition that the system specification are satisfied.

b. when the number of carriers is reduced, the peak power of the multi-carrier combination signal is smaller than that of the full configuration. However, the total average power outputted by the wide-band power amplifier 106 is equal to or slightly larger than the total average output power of the full configuration.

c. the configurations with different number of carriers correspond to the different gain adjusting coefficients 206. When the configurations are with the same number of carriers, the coefficient of the number of the respective carriers can also be different, provided that the condition in step b is satisfied.

d. the less the number of carriers, the more the total average power outputted from the power amplifier 106 will be, and the lower the peak power will be; and vise versa.

e. the calculation method for all of the gain adjusting coefficients are under the premise of not modifying the hardware and satisfying the specification requirement.

4. After the gain adjusting coefficients for the respective carriers are obtained, they are stored in corresponding registers. Once the coefficients are set, they are not changed even in a state when the data transmission is not continuous. Only when the number of carriers or some particular requirements are required to be changed by a user, these coefficients are obtained again according to the preceding steps 1–3.

In the present invention, the transmission power of the carriers, the coverage of the base station, and the operation efficiency of the base station can be increased by changing the gain adjusting coefficients of the respective carriers in the digital intermediate frequency section under the premise of not modifying the hardware and not causing the specification to be worse.

The output amplitude of the carriers can be adjusted by utilizing the gain adjusting coefficients 206 to satisfy the requirement of the wide-band base station system for the different number of carriers and output power. When the number of carriers is reduced, the output power of each of or a part of carriers are increased.

When the number of carriers is reduced, the sum of the average output power of the respective carriers can be equal to or slightly larger than the average output power of the power amplifier of the full configuration, and at the same time, the peak power are smaller than the peak power of the full configuration.

The setting of the gain adjusting coefficients in the present invention employs that the different number of carriers corresponds to the different gain adjusting coefficient 206. It is appreciated that when the system is configured with the same number of carriers, the gain adjusting coefficients of the respective carriers can be different, but the above principles are followed.

INDUSTRIAL APPLICATION

The method and apparatus of the present invention can be used properly in a wide-band multi-carrier base station system. When the carriers are not configured in a full configuration, the transmission power of each of or some of the carriers is increased, thereby increasing the operation efficiency of the base station system and the coverage of the base station system.

What is claimed is:

1. A method of increasing output power of a plurality of carriers of a wide-band multi-carrier base station system, comprising the steps of:
   providing the wide-band multi-carrier base station system according to maximum capacity of system design, and assigned specifications which satisfies system performance specification under a full configuration;
   closing off a number of carriers of the wide-band multi-carrier base station system by software when a number of carriers for outputting is required to be reduced;
   increasing the output power of each of the plurality of carriers by setting gain adjusting coefficients of the respective carriers based on the number of carriers supported by the wide-band base station system and requirement by a user; and
   storing the gain adjusting coefficients in a plurality of registers and retrieving the gain adjusting coefficients based on a configuration condition to control gain of the respective carriers so as to reach the maximum output power.

2. The method of claim 1, wherein once the gain adjusting coefficients of the respective carriers are set, the gain adjusting coefficients are not changed.

3. The method of claim 1, wherein
   when the number of carriers is reduced, peak power of combined signals from the carriers is smaller than that of the full configuration, total average power outputted by a power amplifier is not less than total average output power of the full configuration;
   a configuration with different number of carriers corresponds to different gain adjusting coefficients, and when configurations have the same number of carriers, the coefficients of the number of the respective carriers are different;
   the less the number of the carriers, the more total average power outputted from the power amplifier, and the lower the peak power is, and vise versa; and
   the gain adjusting coefficients are adjusted under premise that system hardware is not modified, and specification is satisfied.

4. The method of claim 1, wherein the gain adjusting coefficients are used to adjust output amplitudes of the carriers to satisfy requirement for different number of carriers and different output power of the wide-band base station system, and the output power of at least a part of the carriers is increased when the number of carriers is reduced.

5. The method of claim 1, wherein the gain adjusting coefficients are used to increase the output power of the carriers, when the number of carriers is reduced, summation of an average output power of the respective carriers is not less than an average output power of a power amplifier of the full configuration, and peak power is less than peak power of the full configuration.

6. The method of claim 1, wherein different number of the carriers corresponds to different gain adjusting coefficients, when a configuration of the number of carriers is the same, the gain adjusting coefficient of the respective carriers are different.

7. An apparatus for increasing output power of a plurality of carriers of a wide-band multi-carrier base station system, comprising:
   a plurality of baseband processors;
   a plurality of digital up-converters for adjusting gain adjusting coefficients;
   a multiplexing and combining adder;
   a wide-band digital to analog converter;
   a wide-band transmitter
   a wide-band power amplifier;
   an antenna for transmitting signals;
   wherein outputs of the plurality of baseband processors are connected to inputs of the plurality of digital up-converters, respectively; outputs of the digital up-converters are connected to the wide-band digital to analog converters via the multiplexing and combining adder, the wide-band digital to analog converters are connected to the wide-band transmitter, the wide-band transmitter is connected to the wide-band power amplifier, and the wide-band power amplifier is connected to the antenna; and wherein each of the digital up-converters comprises:
  a modulator;
  a first multiplier;
  an interpolator and filter;
  a second multiplier;
  a digital controlled oscillator; and
  wherein signals from one of the baseband processors are modulated and outputted to the first multiplier, and at the same time, the gain adjusting coefficients are inputted to the first multiplier, outputs of which are sent to the second multiplier after interpolating and filtering, an oscillating signal is outputted by the digital controlled oscillator to the second multiplier at the same time, and outputs from the second multiplier are sent to the multiplexing and combining adder.

8. The apparatus of claim 7, wherein the first and second multipliers are low rate digital multipliers.

* * * * *